United States Patent
Yang et al.

(10) Patent No.: US 12,022,223 B2
(45) Date of Patent: Jun. 25, 2024

(54) CMOS IMAGE SENSOR WITH INTERNAL REFERENCE VOLTAGE AND CURRENT DETECTING CIRCUIT AND METHOD

(71) Applicant: SmartSens Technology (HK) Co., Ltd, Kwun Tong Kowloon (HK)

(72) Inventors: Guang Yang, Shanghai (CN); Jing Yang, Shanghai (CN); Jinjian Hou, Shanghai (CN); Guanjing Ren, Shanghai (CN); Yaowu Mo, Shanghai (CN)

(73) Assignee: Smart Sens Technology (HK) Co., Ltd., Kwun Tong Kowloon (HK)

( * ) Notice: Subject to any disclaimer, the term of this patent is extended or adjusted under 35 U.S.C. 154(b) by 35 days.

(21) Appl. No.: 17/951,828

(22) Filed: Sep. 23, 2022

(65) Prior Publication Data
US 2024/0022841 A1    Jan. 18, 2024

(30) Foreign Application Priority Data

Jul. 14, 2022  (CN) .................. 202210828040.X
Jul. 14, 2022  (CN) .................. 202221840068.7

(51) Int. Cl.
| | | |
|---|---|---|
| *H04N 25/77* | (2023.01) | |
| *H03M 1/10* | (2006.01) | |
| *H03M 1/34* | (2006.01) | |
| *H04N 25/772* | (2023.01) | |

(52) U.S. Cl.
CPC ........ *H04N 25/772* (2023.01); *H03M 1/1071* (2013.01); *H03M 1/34* (2013.01)

(58) Field of Classification Search
CPC ..... H04N 25/772; H03M 1/1071; H03M 1/34
See application file for complete search history.

(56) References Cited

U.S. PATENT DOCUMENTS 11,363,228 B1 * 6/2022 Elsayed .................. H03M 1/56

* cited by examiner

*Primary Examiner* — Twyler L Haskins
*Assistant Examiner* — Fayez A Bhuiyan
(74) *Attorney, Agent, or Firm* — Eric Karich; Karich: Associates

(57) ABSTRACT

An image sensor array and circuit design and method employing a voltage and current detection circuit capable of quantifying a power signal, grounding signal, internal reference voltage and internal reference current. An image sensor comprising the invented circuit design may be incorporated within a digital camera.

29 Claims, 5 Drawing Sheets

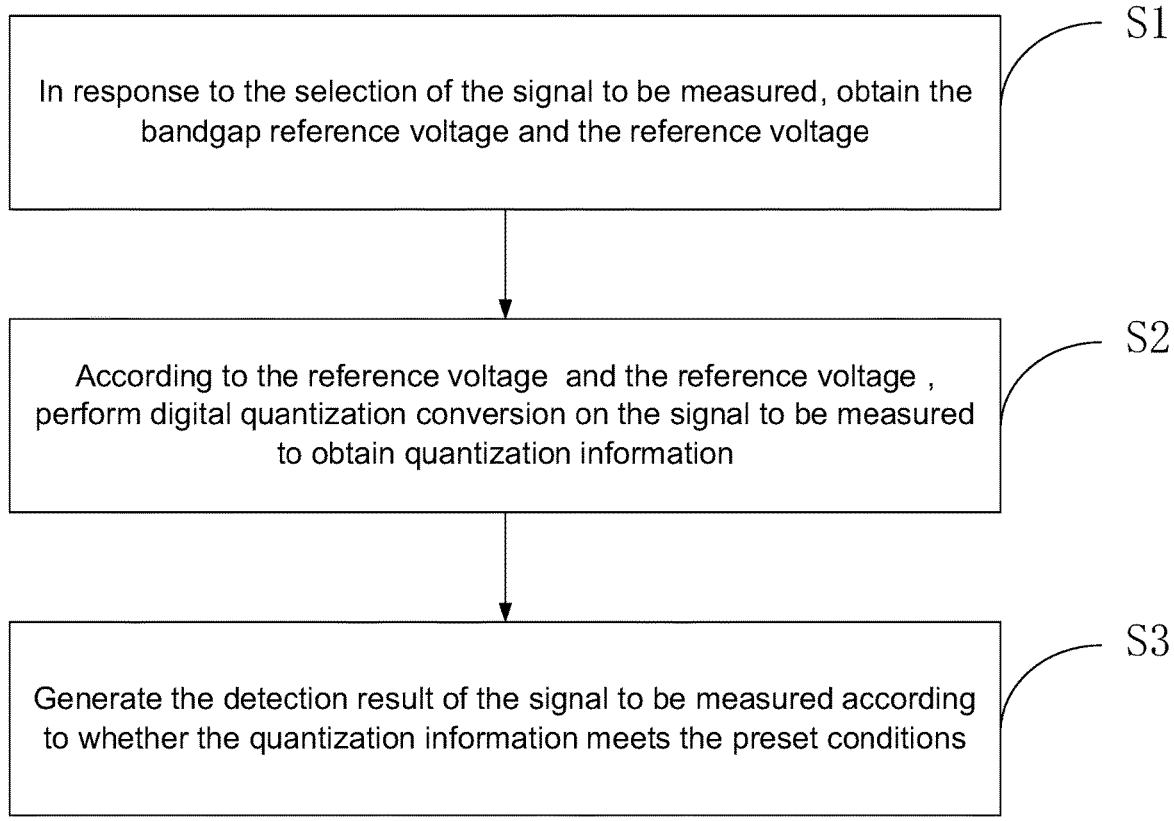
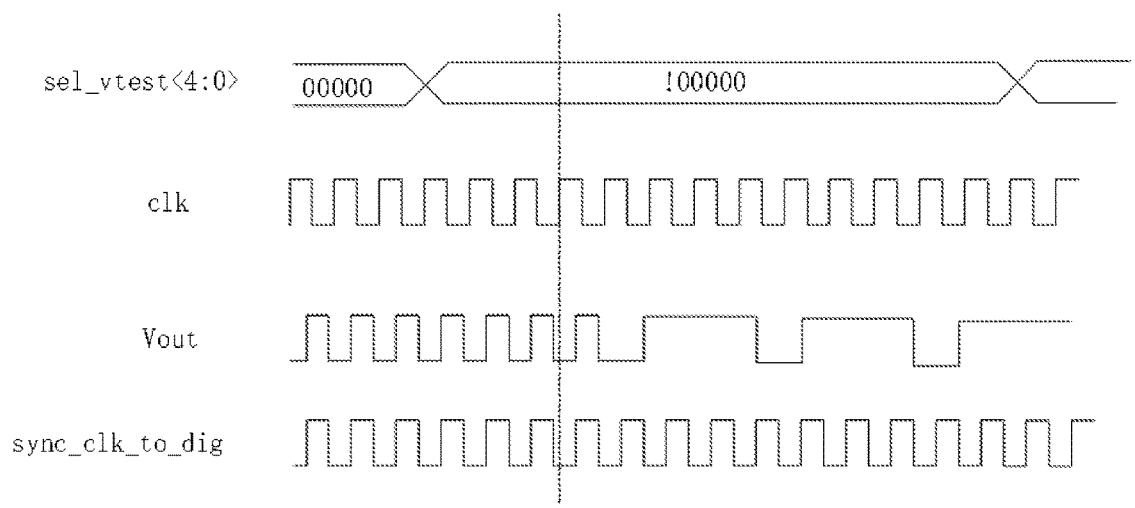

CMOS IMAGE SENSOR WITH INTERNAL REFERENCE VOLTAGE AND CURRENT DETECTING CIRCUIT AND METHOD

BACKGROUND OF THE INVENTION

Field of the Invention

This invention relates generally to image sensors, and more particularly to CMOS image sensors. The present invention provides an image sensor array and circuit design and method employing a voltage and current detection circuit capable of quantifying a power signal, grounding signal, internal reference voltage and internal reference current. An image sensor comprising the invented circuit design may be incorporated within a digital camera.

DESCRIPTION OF RELATED ART

An image capture device includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, a computer and a myriad of automotive vehicle systems.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. Image sensors employed in automotive applications have additional requirements placed on them in order to facilitate electrical system failure risk reduction. For example in order to facilitate failure mode diagnosis and monitoring in advance of failures it is required that there be real time monitoring of the image sensor power supply voltage, ground voltage and various internal reference voltage and current values. Such monitoring is useful since any abnormality in these datum may provide advance warning of a system failure or alternatively offer valuable information during post failure analysis. The present invention fulfills these needs and provides further advantages as described in the following summary.

SUMMARY OF THE INVENTION

The present invention teaches certain benefits in construction and use which give rise to the objectives described below.

In a CMOS image sensor, a pixel array is composed of several pixel units, the pixel unit often adopting a 3T, 4T or 5T structure. The 4T, for example, consists of a transfer transistor, a reset transistor, a source follower transistor, and a row select transistor. The pixel unit uses photodiodes to perform photoelectric conversion to form photo-generated carriers and generate analog signals. By gating and reading the rows of the pixel array, the analog signals of each column are read out with subsequent operational gain amplification, analog-to-digital conversion, etc. comprising the signal processing process. In order to perform all the required imaging and image processing functions the image sensor requires a reliable power supply to provide supply voltages and currents as well as various reference voltages and currents in order to obtain optimized imaging signals and to perform logical functions and other precise functions. The invention provides a voltage and/or current detection circuit, which comprises a reference voltage VBG and a reference voltage Vref generation circuit, a voltage and/or current selection circuit, an analog-to-digital conversion circuit and a comparison circuit. The voltage and/or current selection circuit comprises a selection switch, which selects the real time quantized voltage or current of a certain circuit. The analog-to-digital conversion circuit quantizes the voltage or current of a selected circuit. The comparison circuit compares the digital signal output of the analog-to-digital conversion circuit with an expected value to obtain the judgment result. Among the problems overcome by the invention are the variability in the internal reference voltage and current which can lead to the loss of image sensor function and ultimately result in functional safety risks in the operation of the automotive vehicle.

A primary objective of the present invention is to provide an image sensor circuit design and method employing a voltage and current detection circuit capable of quantifying a power signal, grounding signal, internal reference voltage and internal reference current. which has advantages not taught by the prior art.

Another objective of the present invention is to provide an image sensor circuit design and method to be employed in automotive applications where image sensors have additional requirements placed on them in order to facilitate electrical system failure risk reduction.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention.

FIG. 7 is a flowchart of a signal detection method according to an embodiment of the present application.

FIG. 8 is a timing chart of an input clock and an output signal of an embodiment of the present application.

Figure 1:
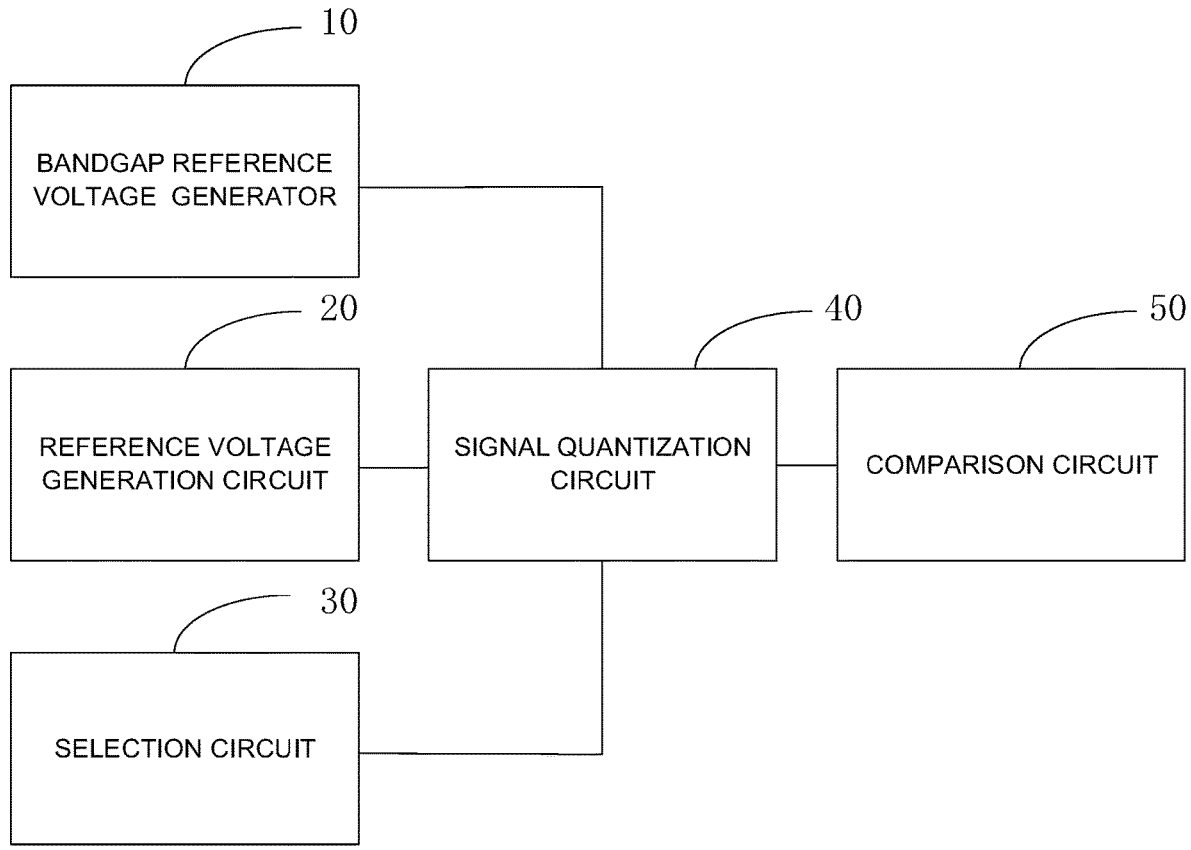
FIG. 1 is a block diagram of a signal detection circuit according to an embodiment of the present application.

The realization, functional features and advantages of the purpose of this invention will be further described with reference to the attached drawings in combination with the embodiments. Through the above drawings, the specific embodiments of the invention have been shown, which will be described in more detail later. These drawings and textual descriptions are not intended to limit the scope of the concept of the application in any way, but to explain the concept of the application to those skilled in the art by referring to specific embodiments.

DETAILED DESCRIPTION OF THE INVENTION

The above-described drawing figures illustrate the invention, an image sensor pixel power supply noise suppression circuit and method.

Various embodiments of an image sensor array and circuit design and method employing a voltage and current detection circuit capable of quantifying a power signal, grounding signal, internal reference voltage and internal reference current are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Throughout the specification and claims, the following terms take the callings explicitly associated herein, unless the context clearly dictates otherwise. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Should the invention involve a stacked chip arrangement, the front sides of two chips may be directly connected since the electrical interconnects on each chip will most commonly be formed on the front sides of each chip, or the front side of one chip may be directly connected to the backside of the second, which may employ through chip interconnects. Although circuit elements may be fabricated on the back side, when reference is made to certain circuit elements residing within or formed in a substrate, this is generally accepted to mean the circuits reside on the front side of the substrate.

The invention provides a signal detection circuit, method, image sensor and storage medium, which are used to provide voltage and current detection capability on an image sensor chip. On the one hand, the application provides a signal detection circuit, specifically including a bandgap reference voltage generator, a reference voltage generation circuit, a selection circuit, a signal quantization circuit and a comparison circuit. The bandgap reference voltage generator is used to generate a reference voltage. The reference voltage generation circuit is used to generate a reference voltage. The selection circuit is used for selecting the signal to be tested. The signal quantization circuit is respectively connected with the bandgap reference voltage generator, the reference voltage generation circuit and the selection circuit, and is used for digital quantization conversion of the signal to be measured to obtain quantization information according to the reference voltage and the reference voltage. The comparison circuit is connected with the signal quantization circuit to generate the detection result of the signal to be tested according to whether the quantization information meets the preset conditions. Alternatively, the signal quantization circuit in the signal detection circuit includes a current conversion circuit, $\Sigma$-$\Delta$ Type ADC and counter. The current conversion circuit includes a reference current source for converting the bandgap reference voltage into a reference current and a current source to be measured for converting the signal to be measured into a current to be measured. The $\Sigma$-$\Delta$ Type ADC is used to perform analog-to-digital quantization conversion of the current to be measured according to the reference current and the reference voltage to obtain a quantized signal. The counter is used to generate the counting result as the quantization information according to the quantization signal.

Alternatively, in the signal detection circuit, the driving clock signal of the $\Sigma$-$\Delta$ type ADC and the output quantization signal have a delay matching circuit. Alternatively, the counter uses the $\Sigma$-$\Delta$ type ADC drives the clock signal to count. Optionally, the signal detection circuit also includes a current amplification circuit. When the signal to be measured selected by the selection circuit is a current signal, the current amplification circuit amplifies the current signal into the current to be measured. Alternatively, the current amplification circuit realizes different current gains through current-mirrors and switches.

Optionally, the current conversion circuit further comprises a base current source for converting the bandgap reference voltage into a base current; the base current source is connected in parallel with the current source to be measured. The base current source is connected in parallel with the current source to be measured. Optionally, the signal quantization circuit in the signal detection circuit also includes a load capacitor and a first comparator, the first end of the load capacitor is grounded, and the second end of the load capacitor is connected with the current input end of the current source to be measured and the current output end of the reference current source. The first input end of the first comparator is connected with the second end of the load capacitor, and the second input end of the first comparator inputs the reference voltage.

Optionally, the signal quantization circuit in the signal detection circuit also includes a charging control switch, the first end of the charging control switch is connected with the output end of the reference current, the second end of the charging control switch is connected with the second end of the load capacitor, and the third end of the charging control switch is connected with the output end of the first comparator. Optionally, the current conversion circuit in the signal detection circuit includes a first conversion circuit, which includes a second comparator, at least one first switching device, at least one second switching device, a third switching device and a first resistor. The first input end of the second comparator inputs the reference voltage, the second input end of the second comparator is connected with the output end of the at least one first switch, the output end of the second comparator is connected with the control end of the at least one first switch and the control end of the at least one second switch, and the second input end of the second comparator is grounded through the first resistance. The control end of the at least one first switch and the input end of the at least one second switch are connected with the first preset voltage, the output end of the at least one second switch is connected with the control end and input end of the third switch, and the output end of the third switch is grounded.

Optionally, the first conversion circuit in the signal detection circuit also includes at least one first switch, and at least one of the first switching devices is correspondingly connected to the second input of the second comparator through a first switch. And/or, the first conversion circuit may also include at least one second switch, and at least one second switch is correspondingly connected with the control end of the third switch through a second switch. Optionally, the first conversion circuit in the signal detection circuit also includes a third switch, which is connected between the control end of the third switch and the ground.

Optionally, the current conversion circuit in the signal detection circuit includes a second conversion circuit, which includes a third comparator, at least one fourth switching device, a fifth switching device, a sixth switching device and a second resistor. The first input end of the third comparator inputs the voltage to be measured, the second input end of the third comparator is connected with the output end of the at least one fourth switch, the output end of the third comparator is connected with the control end of the at least one fourth switch and the control end of the fifth switch, and the second input end of the third comparator is grounded through the second resistance. The control end of the at least one fourth switch and the input end of the fifth switch are connected with a second preset voltage, the output end of the fifth switch is connected with the control end and input end of the sixth switch, and the output end of the sixth switch is grounded. Optionally, the second conversion circuit in the signal detection circuit also includes at least one fourth switch, and at least one fourth switch is correspondingly connected to the second input of the third comparator through a fourth switch. Optionally, the second conversion circuit in the signal detection circuit also includes a voltage range selection circuit, which includes a fifth switch, a sixth switch, a seventh switch, a third resistor, a fourth resistor, a fifth resistor and a sixth resistor. The first end of the fifth switch, the sixth switch and the seventh switch inputs the voltage to be measured, and the second end of the seventh switch is connected with the first input end of the third comparator. The second end of the fifth switch is grounded through the third resistance and the fourth resistance in series, the common end of the third resistance and the fourth resistance is connected to the first input end of the third comparator, and/or the second end of the sixth switch is connected to the third preset voltage through the fifth resistance and the sixth resistance in series, and the common end of the fifth resistance and the sixth resistance is connected to the first input end of the third comparator.

Alternatively, the second conversion circuit in the signal detection circuit realizes different gains through current mirror structure and switch selection. On the other hand, the present application provides a signal detection method, which is specifically applied to the signal detection circuit described above. The signal detection method may include:

S1: in response to the selection of the signal to be measured, obtain the bandgap reference voltage and the reference voltage;

S2: according to the reference voltage and the reference voltage, perform digital quantization conversion on the signal to be measured to obtain quantization information; and S3: generate the detection result of the signal to be measured according to whether the quantization information meets the preset conditions.

Optionally, the step of the signal detection method in performing the digital quantization conversion of the signal is measured according to the reference voltage and the bandgap reference voltage to obtain quantization information may include:

S10: convert the signal to be measured into the current to be measured;

S20: discharge the load capacitance of the comparator with the current to be measured;

S30: when the voltage of the load capacitor is less than the reference voltage, charge the load capacitor with a reference current until the voltage of the load capacitor is greater than the reference voltage; and S40: when the voltage of the load capacitor is greater than the reference voltage, disconnect the reference current until the voltage of the load capacitor is less than the reference voltage, and return to S30.

Optionally, the step of discharging the load capacitance of the comparator with the current to be measured in the signal detection method may include:

S21: discharge the load capacitor with base current;

S22: when the voltage of the load capacitor is less than the reference voltage, charge the load capacitor with the reference current until the voltage of the load capacitor is greater than the reference voltage; and S23: when the voltage of the load capacitor is greater than the reference voltage, disconnect the reference current until the voltage of the load capacitor is less than the reference voltage, and return to S21.

Optionally, the step of discharging the load capacitance of the comparator with the current to be measured in the signal detection method includes discharging the load capacitor simultaneously with the base current and the current to be measured in parallel. Alternatively, the signal detection method comprises the following steps before performing the step of charging the load capacitor with a reference current: in response to acquiring a reference voltage, the bandgap reference voltage is converted into the reference current, the base current, and/or the reference voltage.

Optionally, the step of generating the detection result of the signal to be tested according to whether the quantization information meets the preset conditions in the signal detection method includes: the step of charging the load capacitor with the reference current and the step of discharging the load capacitor of the comparator with the current to be measured modulate the waveform information according to the clock signal to describe the duty cycle of the quantization information, and the counter counts the quantization information according to the clock signal and outputs the counting result; when the counting result is in the preset threshold range, it is determined that the signal to be measured meets the working requirements; when the counting result exceeds the preset threshold interval, it is determined that the signal to be measured does not meet the working requirements.

Optionally, the signal to be measured in the signal detection method is selected from at least one of voltage signal, current signal, power signal and ground signal. On the other hand, the present application provides an image sensor, specifically, the image sensor includes a signal detection circuit as described above. Or, the image sensor comprises an interconnected processor and a storage medium, wherein the storage medium is used for storing computer programs and the processor is used to execute the computer program to realize the electrical property detection method as described above.

Alternatively, the image sensor realizes the electrical property detection method within at least one frame by time-sharing multiplexing. Alternatively, the image sensor synchronously realizes the electrical property detection method within the image quantization time. Alternatively, the image sensor sets a preset threshold interval through a register. Optionally, in the image sensor, when the detection result exceeds the preset threshold interval, the image sensor generates overrun report information.

On the other hand, the present application provides a storage medium, specifically, a computer program is stored on the storage medium, and the signal detection method described above is realized when the computer program is executed by the processor. As described above, the signal detection circuit, method, image sensor and storage medium provided by the present application realize the detection function of voltage and current compatibility by quantifying and judging the internal reference voltage and internal reference current.

An exemplary embodiment is described in detail below, and an example thereof is shown in the accompanying drawings. When the following description refers to the drawings, unless otherwise indicated, the same numbers in different drawings represent the same or similar elements. The embodiments described in the following exemplary embodiments do not represent all embodiments consistent with the present application. On the contrary, they are only examples of devices and methods consistent with some aspects of the present application as detailed in the appended claims.

Reference throughout this specification to "one embodiment," "an embodiment," one example, or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furth lore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

It should be noted that in this article, the terms "include", or any other variation thereof are intended to cover non-exclusive inclusion, so that a process, method, article or device that includes a series of elements includes not only those elements, but also other elements not explicitly listed, or elements inherent in such a process, method, article or device. Without further restrictions, the element defined by the sentence "including a . . . " does not exclude that there are other same elements in the process, method, article or device including the element. In addition, components, features and elements with the same name in different embodiments of the application may have the same meaning or different meanings, Its specific meaning needs to be determined by its interpretation in the specific embodiment or further combined with the context in the specific embodiment. It should be understood that the specific embodiments described herein are only used to explain the application and are not used to limit the application.

First Embodiment

On the one hand the application provides a signal detection circuit and FIG. 1 is the block diagram of the signal detection circuit of an embodiment of the application. Referring to FIG. 1, in an embodiment, the signal detection circuit includes a reference voltage generator 10, a reference voltage generation circuit 20, a selection circuit 30, a signal quantization circuit 40, and a comparison circuit 50. The reference voltage generator 10 is used to generate a reference voltage. Alternatively, the reference voltage is generated by the bandgap reference voltage source, which can still be considered as a stable reference voltage when the process angle or power supply voltage or temperature are different. The reference voltage generation circuit 20 is used to generate a reference voltage. Optionally, the reference voltage can be configured by the register, the value within a voltage range can be selected, and the optimal value can be selected according to the measured results. In theory, the reference voltage used has little impact on the performance of the device. The selection circuit 30 is used to select the signal to be tested. Alternatively, the signal to be measured can be a voltage signal to be measured or a current signal to be measured, which is not limited in this application. The signal quantization circuit 40 is connected with the reference voltage generator 10, the reference voltage generation circuit 20 and the selection circuit 30 respectively, and is used for digital quantization conversion of the signal to be measured according to the reference voltage and the reference voltage to obtain quantization information. The comparison circuit 50 is connected with the signal quantization circuit 10 to generate a detection result of the signal to be tested according to whether the quantization information meets the preset conditions. Alternatively, the quantitative information is compared with the expected value to obtain the judgment result. The signal detection circuit realizes the detection function of voltage and current compatibility by quantifying and judging the internal reference voltage and current.

Figure 2:
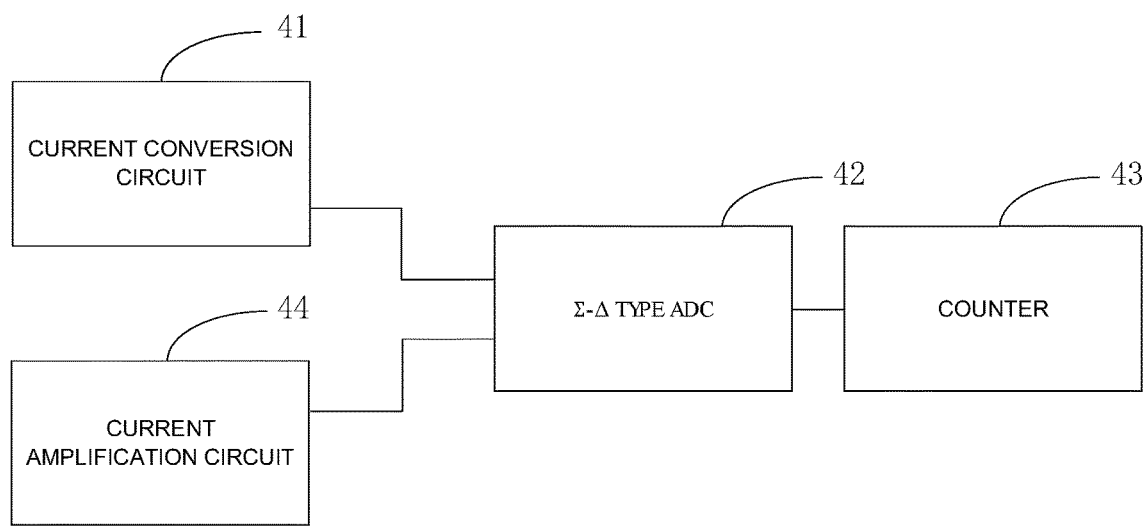
FIG. 2 is a block diagram of a signal quantization circuit according to an embodiment of the present application.

FIG. 2 is a block diagram of a signal quantization circuit according to an embodiment of the present application. Referring to FIG. 2, in an embodiment, the signal quantization circuit 40 in the signal detection circuit includes a current conversion circuit 41, $\Sigma$-$\Delta$ Type ADC 42 and counter 43. The current conversion circuit 41 includes a reference current source for converting a reference voltage into a reference current, and a current source to be measured for converting a signal to be measured into a current to be measured. Optionally, when different current sources to be tested are selected for detection, it is not necessary to switch the size of the reference current source, and the transfer function from the fixed signal to the output signal can be obtained through the fixed reference current source and reference voltage. $\Sigma$-$\Delta$ Type ADC 42 is used to perform analog-to-digital quantization conversion of the current to be measured according to the reference current and reference voltage to obtain the quantized signal. Optionally, Σ-Δ Type ADC 42 is simulated by Σ-Δ Modulator and digital extractor.

The counter 43 is used to generate a count result as quantization information according to the quantization signal. In this embodiment, the current conversion circuit 41 in the signal quantization circuit 40 is used to convert the reference voltage and the voltage signal to be measured into a reference current source and a current source to be measured, which is convenient for Σ-Δ Type ADC 42 and counter 43 perform digital quantization conversion on the signal to be measured to obtain quantization information. In an embodiment, in the signal detection circuit Σ-Δ The driving clock signal and the output quantized signal of type ADC 42 have a delay matching circuit. Alternatively, the delay matching circuit can prevent the loss of individual rising or falling edges of the clock and improve the detection accuracy.

In one embodiment, the counter 43 in the signal detection circuit uses Σ-Δ The driving clock signal of type ADC 42 is counted. Alternatively, the counter 43 may be implemented by a digital circuit, and the counter 43 may be used Σ-Δ Drive clock signal pair of type ADC 42 Σ-Δ Type ADC 42 outputs digital signals for counting, and additional clocks can also be used to count the driving clock signals and the output digital signals respectively. Please continue to refer to FIG. 2. In an embodiment, the signal quantization circuit 40 in the signal detection circuit also includes a current amplification circuit 44. When the signal to be measured selected by the selection circuit 30 is a current signal, the current amplification circuit 44 amplifies the current signal into a current to be measured. Alternatively, when the signal to be measured is a current signal, the current amplification circuit 44 refers to the current signal processing as a quantized current signal for the quantization of the current signal to be measured by the signal quantization circuit 40. In one embodiment, the current amplification circuit 44 in the signal detection circuit is selected by a current mirror and a switch to achieve different current gains. Alternatively, the current amplification circuit 44 can use the accurate current mirroring function of the mirror current source to stabilize the carrying capacity of the current to be measured. Alternatively, the current amplification circuit 44 selects different gain circuit combinations through the switch selection circuit, so that the circuit structure has the ability of gain selection.

Figure 3:
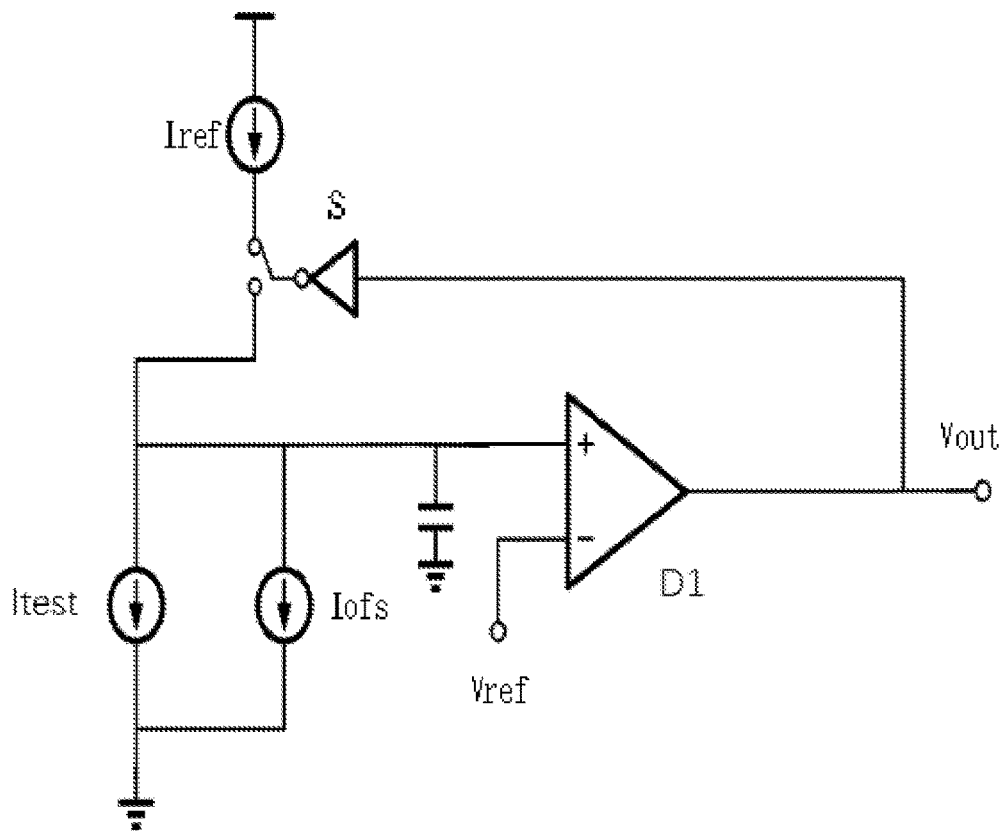
FIG. 3 is a circuit diagram of a signal quantization circuit based on the embodiment of FIG. 2 of the present application.

FIG. 3 is a circuit diagram of a signal quantization circuit based on the embodiment of FIG. 2 of the present application. In an embodiment, the signal quantization circuit 40 in the signal detection circuit also includes a load capacitor C and a first comparator D1. The first end of the load capacitance C is grounded, and the second end of the load capacitance C is connected with the current input end of the current source ITest to be tested and the current output end of the reference current source Iref. The first input end of the first comparator D1 is connected to the second end of the load capacitor C, and the second input end of the first comparator D1 inputs the reference voltage Vref. Alternatively, the current source ITest to be measured discharges the load capacitor C at the first input of the first comparator D1. The reference voltage Fret is coupled to the second input of the first comparator D1. Driven by the clock signal, the first comparator D1 works to quantize the currently selected voltage or current into a digital signal. Referring to FIG. 3, in an embodiment, the current conversion circuit 41 in the signal detection circuit also includes a base current source IOFs for converting a reference voltage into a base current. The base current source IOFs is connected in parallel with the current source ITest to be tested. Alternatively, the base current source IOFs discharges the load capacitor C at the first input of the first comparator D1. In this embodiment, the reference current source Iref is used to realize the function of measuring the current source ITest to be measured by charging the load capacitor C. the base current source IOFs ensures that the output duty cycle obtained when measuring the zero signal has a base value, not 0, by discharging the load capacitor C. The current source ITest and the base current source IOFs to be tested discharge to the load capacitor C by extracting positive charge supplementing negative charge from the load capacitor C.

In one embodiment, the signal quantization circuit 40 in the signal detection circuit also includes a charge control switch s, the first end of which is connected to the output end of the reference current, the second end of which is connected to the second end of the load capacitor C, and the third end of which is connected to the output end of the first comparator D1. Alternatively, the reference current source Iref charges the load capacitor C at the first input of the first comparator D1 under the control of the charging control switch s. The output of the first comparator D1 controls whether the previous stage charges or discharges the load capacitor C node through DFF D-type trigger. The capacitor voltage of the load capacitor C node is compared with the reference voltage Vref of the first comparator D1 to determine whether the current capacitor voltage state is higher or lower than the reference voltage VREF. When the current capacitor voltage state is higher than the reference voltage Vref, the charge control switch S controls the discharge to the load capacitor C, and vice versa, So as to realize the function of controlling the charging time of load capacitor C. The specific implementation principle can be referred to Σ-Δ. The basic functions of type ADC will not be repeated here. In another embodiment, the reference current source Iref is controlled to the ground potential through the inverse signal of the charging control switch s.

Figure 4:
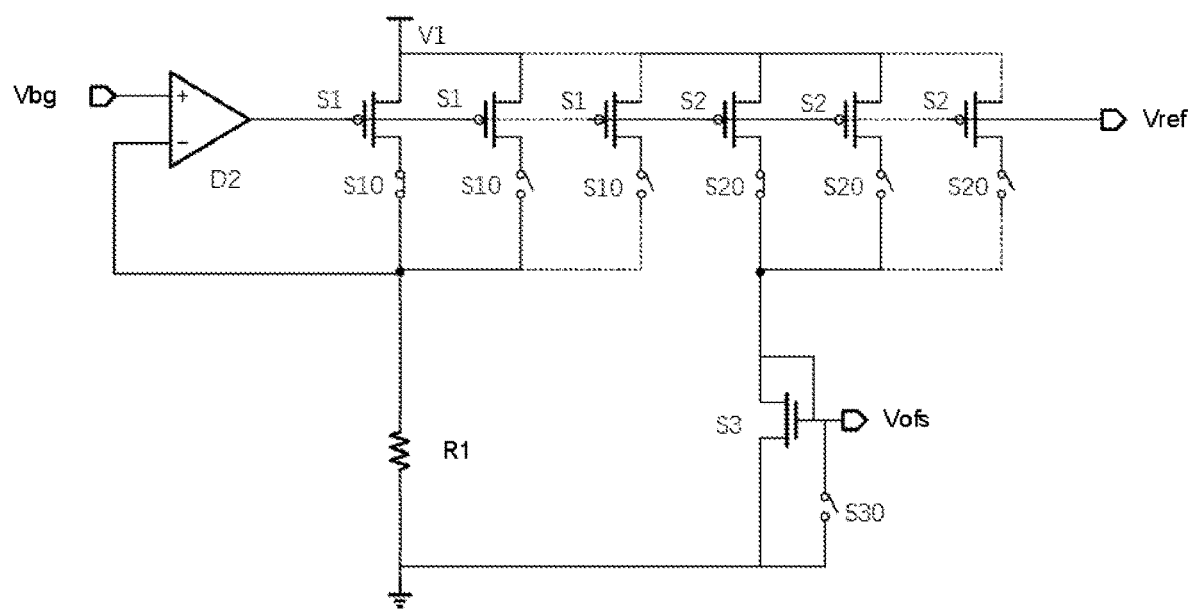
FIG. 4 is a circuit diagram of a first conversion circuit of a current conversion circuit according to an embodiment of the present application.

FIG. 4 is a circuit diagram of a first conversion circuit of a current conversion circuit according to an embodiment of the present application. Referring to FIG. 4, in an embodiment, the current conversion circuit 41 in the signal detection circuit includes a first conversion circuit, which includes a second comparator D2, at least one first switching device S1, at least one second switching device S2, a third switching device S3, and a first resistor R1. Alternatively, the application does not limit the number of the first switch S1 and the second switch S2. Considering the cost and gain comprehensively, select the appropriate number of the first switch S1 and the second switch S2. The application does not limit the size of the first resistor R1. Considering the cost and gain comprehensively, the appropriate size of the first resistor R1 is selected. The first input end of the second comparator D2 inputs the bandgap reference voltage Vbg, the second input end of the second comparator D2 is connected with the output end of at least one first switch S1, the output end of the second comparator D2 is connected with the control end of at least one first switch S1 and at least one second switch S2, and the second input end of the second comparator D2 is grounded through the first resistance R1.

The control end of at least one first switch S1 and the input end of at least one second switch S2 are connected with the first preset voltage V1, the output end of at least one second switch S2 is connected with the control end and input end of the third switch S3, and the output end of the third switch S3 is grounded. Alternatively, the third switching device S3 forms the left side of the first current mirror. Accordingly, the current source in FIG. 3 can be the right side of the first current mirror to realize the stable current output of the current source. The output end of the second switch S2 outputs the first current signal as the reference current signal of the first current mirror. The application does not limit the size of the first preset voltage V1.

Considering the cost and gain comprehensively, the appropriate size of the first preset voltage V1 is selected. For example, the first conversion circuit of the current conversion circuit 41 converts the bandgap reference voltage Vbg into the reference current source Iref. Please continue to refer to FIG. 4. In an embodiment, the first conversion circuit in the signal detection circuit also includes at least one first switch S10, and at least one first switch S1 is correspondingly connected to the second input of the second comparator D2 through a first switch S10. The first conversion circuit also includes at least one second switch S20, and at least one second switch S2 is correspondingly connected to the control end of the third switch S3 through a second switch S20. Alternatively, the present application does not limit the number of the first switch S10 and the second switch S20. The number of the first switch S10 and the second switch S20 may correspond to the number of the first switch S1 and the second switch S2. Considering the cost and gain comprehensively, select the appropriate number of the first switch S10 and the second switch S20. Please continue to refer to FIG. 4.

In one embodiment, the first conversion circuit in the signal detection circuit also includes a third switch S30, which is connected between the control end of the third switch S3 and the ground. Alternatively, the base current source IOFs is controlled to the ground potential through the third switch S30. In this embodiment, the first conversion circuit realizes the conversion ability from the bandgap reference voltage Vbg to the reference current source Iref and the base current source IOFs. The conversion function of the base current source IOFs can be turned off by turning off the second switch S20, and the gain selection ability of the reference current source Iref and the base current source IOFs can also be realized by turning off the first switch S10 and the second switch S20.

Figure 5:
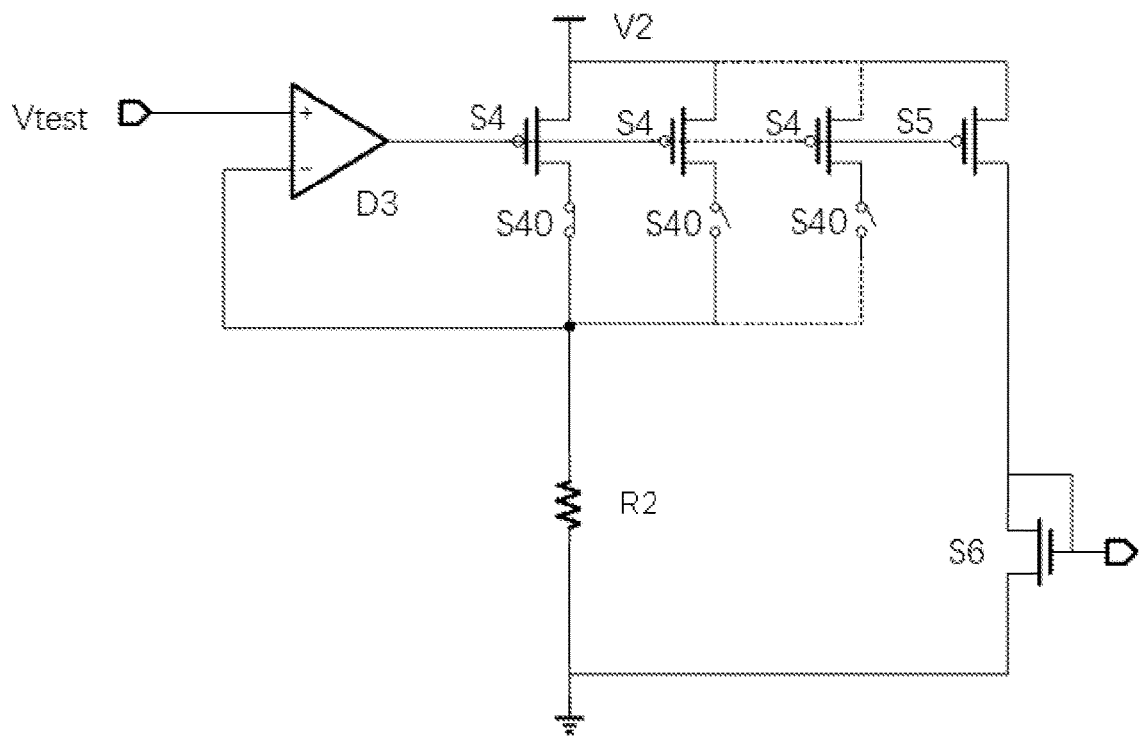
FIG. 5 is a circuit diagram of a second conversion circuit of a current conversion circuit according to an embodiment of the present application.

FIG. 5 is a circuit diagram of a second conversion circuit of a current conversion circuit according to an embodiment of the present application. Referring to FIG. 5, in an embodiment, the current conversion circuit 41 in the signal detection circuit includes a second conversion circuit, which includes a third comparator D3, at least one fourth switch S4, a fifth switch S5, a sixth switch S6, and a second resistor R2. Alternatively, the application does not limit the number of the fourth switch S4. Considering the cost and gain comprehensively, select the appropriate number of the fourth switch S4. The application does not limit the size of the second resistor R2. Considering the cost and gain comprehensively, the appropriate size of the second resistor R2 is selected. The first input end of the third comparator D3 inputs the voltage vtest to be measured, the second input end of the third comparator D3 is connected with the output end of at least one fourth switch S4, the output end of the third comparator D3 is connected with the control end of at least one fourth switch S4 and the control end of the fifth switch S5, and the second input end of the third comparator D3 is grounded through the second resistance R2. The control end of at least one fourth switch S4 and the input end of the fifth switch S5 are connected with the second preset voltage V2, the output end of the fifth switch S5 is connected with the control end and input end of the sixth switch S6, and the output end of the sixth switch S6 is grounded. Alternatively, the sixth switch S6 forms the left side of the second current mirror. Accordingly, the current source in FIG. 3 can be the right side of the second current mirror to realize the stable current output of the current source. The output end of the fifth switch S5 outputs a second current signal as the reference current signal of the second current mirror. The application does not limit the size of the second preset voltage V2.

Considering the cost and gain comprehensively, the appropriate size of the second preset voltage V2 is selected. For example, the second conversion circuit of the current conversion circuit 41 realizes the conversion of the signal to be measured into the current source ITest to be measured. In another embodiment, the size of the second resistor R2 can be the same as that of the first resistor R1, so that the conversion of the voltage to be measured vtest to the current source ITest has the same gain as the conversion of the bandgap reference voltage Vbg to the reference current source Iref, and the switch with current mirror structure has controllable extra gain. In an embodiment, the second conversion circuit in the signal detection circuit also includes at least one fourth switch S40, and at least one fourth switch S4 is correspondingly connected to the second input of the third comparator D3 through a fourth switch S40.

Alternatively, the present application does not limit the number of the fourth switch S40. The number of the fourth switch S40 may correspond to the number of the fourth switch S4. Considering the cost and gain comprehensively, select the appropriate number of the fourth switch S40. By turning on and off at least one fourth switch S40, the second conversion circuit has a switch with a current mirror structure to control an additional gain.

Figure 6:
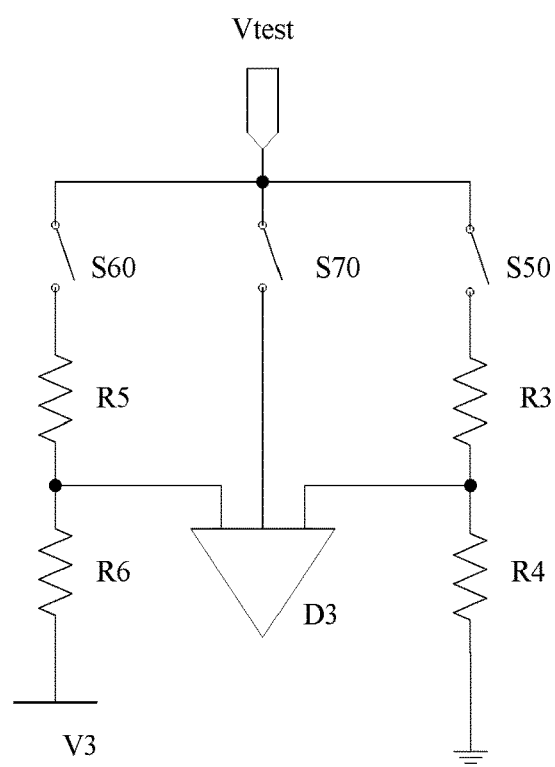
FIG. 6 is a circuit diagram of a voltage range selection circuit based on the embodiment of FIG. 5 of the application.

FIG. 6 is a circuit diagram of a voltage range selection circuit based on the embodiment of FIG. 5 of the application. Referring to FIG. 6, in an embodiment, the second conversion circuit in the signal detection circuit also includes a voltage range selection circuit, which includes a fifth switch S50, a sixth switch S60, a seventh switch S70, a third resistor R3, a fourth resistor R4, a fifth resistor R5, and a sixth resistor R6. The voltage to be measured vtest is input at the first end of the fifth switch S50 the sixth switch S60 and the seventh switch S70, and the second end of the seventh switch S70 is connected to the first input end of the third comparator D3. Optionally, the seventh switch S70 is connected to the third comparator D3 to directly input the voltage to be measured, vtest. The second end of the fifth switch S50 is grounded through the third resistor R3 and the fourth resistor R4 in series, and the common end of the third resistor R3 and the fourth resistor R4 is connected to the first input end of the third comparator D3.

In another embodiment, the second end of the sixth switch S60 is connected to the third preset voltage V3 through the fifth resistor R5 and the sixth resistor R6 in series, and the common end of the fifth resistor R5 and the sixth resistor R6 is connected to the first input end of the third comparator D3. Alternatively, the application does not limit the size of the third resistor R3, the fourth resistor R4, the fifth resistor R5, the sixth resistor R6 and the third preset voltage v3. Considering the cost and voltage range, select the appropriate size of the third resistor R3, the fourth resistor R4, the fifth resistor R5, the sixth resistor R6 and the third preset voltage v3. For example, the second conversion circuit can have a resistance voltage division structure, and the voltage range selection circuit can realize the voltage conversion ability of supporting a voltage higher than one time of the power supply voltage and lower than one time of the ground voltage by controlling the fifth switch S50, the sixth switch S60 and the seventh switch S70, thereby compressing the voltage to be measured vtest, which can improve the measurement range of the whole system. In one embodiment, the second conversion circuit in the signal detection circuit realizes different gains through the current mirror structure and the corresponding fourth switch selection. The second conversion circuit has the ability of gain selection through the structure of current mirror and switch selection circuit.

Second Embodiment

On the other hand, the application provides a signal detection method, and FIG. 7 is a flowchart of the signal detection method of an embodiment of the application. Referring to FIG. 7, in an embodiment, the signal detection method is applied to the signal detection circuit as described above, including:
- S1: acquire the reference voltage and reference voltage in response to the selection of the signal to be measured. Alternatively, the reference voltage is generated by the bandgap reference voltage source, which can still be considered as a stable reference voltage when the process angle or power supply voltage or temperature are different. The reference voltage can be configured by the register, the value within a voltage range can be selected, and the optimal value can be selected according to the measured results. In theory, the reference voltage used has very little impact on the performance.
- S2: according to the reference voltage and reference voltage, the signal to be measured is digitally quantized and converted to obtain quantized information; and
- S3: generate the detection result of the signal to be tested according to whether the quantization information meets the preset conditions.

In this embodiment, the signal detection method realizes the detection function of voltage and current compatibility by quantifying and judging the internal reference voltage and internal reference current.

In an embodiment, the signal detection method performs S2: according to the reference voltage and the reference voltage, the steps of digital quantization conversion of the signal to be measured to obtain quantization information include:
- S10: convert the signal to be measured into the current to be measured;
- S20: discharge the load capacitance of the comparator with the current to be measured;
- S30: when the voltage of the load capacitor is less than the reference voltage, charge the load capacitor with the reference current until the voltage of the load capacitor is greater than the reference voltage; and
- S40: when the voltage of the load capacitor is greater than the reference voltage, disconnect the reference current until the voltage of the load capacitor is less than the reference voltage, and return to S30.

In this embodiment, the signal detection method controls the current to be measured to discharge the load capacitance at the input end of the comparator. The voltage of the load capacitor is compared with the reference voltage of the comparator to determine whether the current capacitor voltage state is higher or lower than the reference voltage. When the current capacitor voltage state is lower than the reference voltage, the reference currents controlled to charge the load capacitor, so as to realize the digital quantization of the signal to be measured.

In one embodiment, the signal detection method may include the following steps before performing S20: discharging the load capacitance of the comparator with the current to be measured;
- S21: discharge the load capacitor with base current;
- S22: when the voltage of the load capacitor is less than the reference voltage, charge the load capacitor with the reference current until the voltage of the load capacitor is greater than the reference voltage;
- S23: when the voltage of the load capacitor is greater than the reference voltage, disconnect the reference current until the voltage of the load capacitor is less than the reference voltage, and return to S21. In this embodiment, the signal detection method controls the base current to discharge the load capacitance at the input end of the comparator. The voltage of the load capacitor is compared with the reference voltage of the comparator to determine whether the current capacitor voltage state is higher or lower than the reference voltage. When the current capacitor voltage state is lower than the reference voltage, the reference current is controlled to charge the load capacitor. In an embodiment, the signal detection method performs S20: discharging the load capacitance of the comparator with the current to be measured, including: S24: discharge the load capacitor with the parallel base current and the current to be measured at the same time. Optionally, the base current is the discharge current, ensuring that the output duty cycle obtained when measuring the zero signal has a base value. The signal detection method realizes the discharge of the load capacitor by controlling the on-off of the parallel base current. In an embodiment, the signal detection method before performing S22: charging the load capacitor with a reference current includes:
- S25: in response to acquiring the reference voltage, convert the reference voltage into reference current, base current and/or reference voltage. Alternatively, the signal detection method can obtain the transfer function from the fixed signal to be measured to the output signal through a fixed reference voltage.

FIG. 8 is a timing chart of an input clock and an output signal of an embodiment of the present application. Referring to FIG. 8, in an embodiment, the signal detection method performs S3: the steps of generating the detection result of the signal to be tested according to whether the quantization information meets the preset conditions include:
- S31: the step of charging the load capacitor with the reference current and the step of discharging the load capacitor of the comparator with the current to be measured modulate the waveform information according to the clock signal to describe the duty cycle of the quantization information. The counter counts the quantization information according to the clock signal and outputs the counting result. For example, sel_ Vtest<4:0> select the voltage to be tested vtest, SEL through MUX_ Vtest<4:0> is a 5 bit register. This application does not limit the number of bits of the register, and the actual sel_ The bit number of vtest is expandable in design. For example, when it is 8 bit, 28 kinds of voltage or current to be measured can be selected.
- S32: when the counting result is in the preset threshold range, it is determined that the signal to be measured meets the working requirements;
- S32: when the counting result exceeds the preset threshold range, it is determined that the signal to be measured does not meet the working requirements. Alternatively, the application does not limit the size of the preset threshold interval. Considering the cost and detection accuracy, the appropriate preset threshold interval is selected. In an embodiment, the type of signal to be measured in the application is not limited, and the signal to be measured in the signal detection method is selected from at least one of voltage signal, current signal, power signal and grounding signal.

Figure 9:
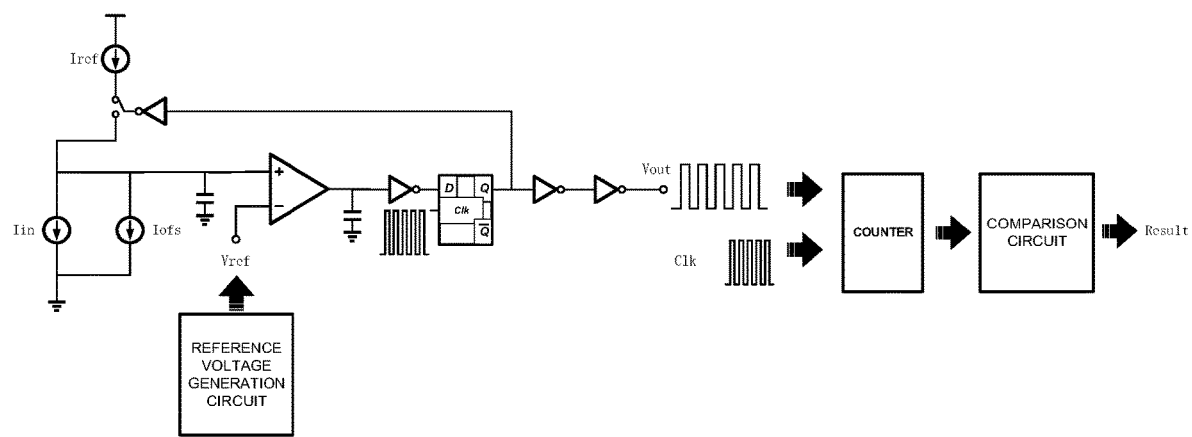
FIG. 9 is a voltage/current detection circuit diagram of an embodiment of the present application.

FIG. 9 is a voltage/current detection circuit diagram of an embodiment of the present application. For example, a signal detection method is applied to a voltage/current detection circuit. Please refer to f FIG. 9 and FIG. 1-8 at the same time. The voltage/current detection circuit includes: bandgap reference voltage Vbg and reference voltage Vref generation circuit, voltage/current selection circuit, analog-to-digital conversion circuit and comparison circuit; The voltage/current selection circuit includes a selection switch to select a current quantized voltage or current; The analog-to-digital conversion circuit quantifies the selected voltage or current; The comparison circuit compares the digital signal output by the analog-to-digital conversion circuit with the expected value to obtain the judgment result. Further, the analog-to-digital conversion circuit includes a voltage to current conversion circuit, a current amplification circuit Σ-Δ Type ADC counter. Further, after the voltage/current selection circuit selects a currently quantized voltage vtest to be measured, the voltage signal vtest is processed into a converted current signal iv2i through the voltage to the second conversion circuit. After selecting a certain current ITest to be measured, the current signal is processed into a quantized current signal iin through the current amplification circuit, At the same time, the bandgap reference voltage: Vbg is processed into the reference current signal Iref and the base current signal IOFs through another set of voltage to the first conversion circuit. The converted current signal iv2i or the quantized current signal iin and the base current signal IOFs discharge the load capacitance at one input end of the ADC. The reference current signal Iref is Σ-Δ The load capacitor at one input of ADC is charged under the control of type a ADC feedback switch, and the reference voltage Vref is coupled to the other input of ADC. Driven by the clock signal CLK, Σ-Δ Type ADC works, quantizing the currently selected voltage or current into a digital signal Vout.

Further, the voltage to first conversion circuit of the bandgap reference voltage Vbg can have the conversion ability from the bandgap reference voltage Vbg to the reference current signal Iref and from the bandgap reference voltage Vbg to the base current signal IOFs, the conversion function of the base current signal IOFs can be turned off by switching, and the conversion ability of the reference current signal Iref and the base current signal IOFs can have gain selection ability. Further, the voltage to second conversion circuit of the voltage to be measured vtest can have a resistance voltage division structure, and can support the sub-voltage conversion capability of higher than one time the power supply voltage and lower than one time the ground voltage. Further, the voltage to the second conversion circuit of the voltage to be measured may have the same gain as the voltage of the bandgap reference voltage Vbg to the reference current signal Iref in the first conversion circuit, that is, exactly the same R1, R2 to RN. The voltage to first conversion circuit and the voltage to second conversion circuit maintain the same gain in design, and the switch with current mirror structure can control additional gain. Further, the current amplification circuit can have the ability of gain selection, such as realizing different current gains through current mirror and switch selection. Further, the analog-to-digital conversion circuit has a switch to select whether voltage or current is currently detected, which can be selected by using the signal of the voltage/current selection circuit. Further, the reference current signal Iref is Σ-Δ. Under the control of a type ADC feedback switch, the reference current signal Iref can be controlled to the ground potential through the inverse signal of the feedback switch beyond the charging time of the load capacitor at one input end of the ADC. Further, Σ-Δ The driving clock signal CLK and the output digital signal Vout of type ADC can have a delay matching circuit. Further, the counter be realized by a digital circuit, and the counter can be used Σ-Δ Drive clock signal CLK pair of type ADC Σ-Δ The digital signal output by type ADC is counted Vout, and additional clock can also be used to count the driving clock signal CLK and the output digital signal Vout respectively. Further, the comparison circuit can be realized by a digital circuit. Based on the above circuit, the signal detection method that the image sensor can realize includes: integrating the voltage/current detection circuit in the image sensor, connecting the desired power supply, ground, internal reference voltage and internal reference current signals to the port of the voltage/current detection circuit, and quantifying and judging the detected voltage/current through the voltage/current selection circuit. Further, the voltage/current detection circuit has an expandable number of ports. Further, the detection of voltage/current in the working process of image sensor has the form of time-sharing multiplexing; Voltage/current detection multiplexes subsequent circuits including ADC to save circuit resources. Further, during the working process of the image sensor, all the power supply, ground, internal reference voltage and internal reference current that are expected to be detected can have the function of completing the cycle detection in one frame time, and can also have the function of completing the cycle detection in multiple frames; Through time-sharing multiplexing, multi-channel voltage or current detection can be realized in one cycle. Further, the cyclic detection function during the working process of the image sensor can be carried out within the image quantization title, or separately within the non-quantization time; Further, the threshold value for the image sensor to judge the quantized value of any power supply, ground, internal reference voltage and internal reference current can have a separate configuration function, such as setting through a register; Noise interference can be avoided by setting the judgment threshold independently.

Further, after quantifying and judging any of the power supply, ground, internal reference voltage and internal reference current, if the image sensor believes that the voltage or current exceeds the expected range, it can have the function of reporting to the outside of the image sensor, such as by changing the pull-up or pull-down state of a specific pin. The voltage/current detection circuit used in the above signal detection method, based on the delta sigma ADC architecture, is compatible with level detection that is higher than one time the supply voltage and lower than one time the ground voltage. Voltage/current detection multiplexes subsequent circuits including ADC to save circuit resources. Through time-sharing multiplexing, multi-channel voltage or current detection can be realized in one cycle. Noise interference can be avoided by setting the judgment threshold independently. The voltage to first conversion circuit and the voltage to second conversion circuit maintain the same gain in design.

Third Embodiment

In a third embodiment, the present application provides an image sensor, specifically, the image sensor includes the above signal detection circuit. In another embodiment, the image sensor includes an interconnected processor and a storage medium, wherein the storage medium is used to store a computer program. The processor is used to execute a computer program to implement the above signal detection method. In this embodiment, the image sensor realizes the detection function of voltage and current compatibility by quantifying and judging the internal reference voltage and internal reference current. In one embodiment, the image sensor realizes the signal detection method in at least one frame by time-sharing multiplexing.

Optionally, the detection of voltage/current in the working process of the image sensor has the form of time-sharing multiplexing. The voltage/current detection multiplexes the circuit components including the comparator. Through time-sharing multiplexing, multiple voltage or current detection can be realized in one cycle, saving circuit resources. In one embodiment, the image sensor synchronously implements the signal detection method within the image quantization time. Alternatively, during the working process of the image sensor, all the power supplies, grounds, internal reference voltages and internal reference currents that are expected to be detected can have the function of completing the cyclic detection within one frame, or can have the function of completing the cyclic detection within multiple frames. The preset detection cycle of completing the cyclic detection within multiple frames can be changed. During the working process of the image sensor, the circular detection function can be carried out within the image quantization time, or separately within the non-quantization time. In one embodiment, the image sensor sets a preset threshold interval through a register. In this embodiment, the threshold value that the image sensor judges the quantized value of any power supply, ground, internal reference voltage and internal reference current can have a separate configuration function, such as setting through a register. The graphic sensor can avoid noise interference by setting the judgment threshold independently. Optionally, the judgment threshold set by the register is adjustable.

In an embodiment, the image sensor generates overrun report information when the detection result exceeds the preset threshold interval. In this embodiment, the image sensor can report to the outside of the image sensor if it believes that the voltage or current exceeds the expected range after quantifying and judging any of the power supply, ground, internal reference voltage and internal reference current. For example, the graphics sensor can generate warning information by changing the pull-up or pull-down state of a particular pin. For example, the graphics sensor voltage/current detection circuit has an expandable number of ports.

For example, an image sensor has a built-in voltage/current detection circuit. Please refer to FIG. 9 and FIG. 1-8 at the same time. The voltage/current detection circuit includes: bandgap reference voltage Vbg and reference voltage Vref generation circuit, voltage/current selection circuit, analog-to-digital conversion circuit and comparison circuit; The voltage/current selection circuit includes a selection switch to select a current quantized voltage or current; The analog-to-digital conversion circuit quantifies the selected voltage or current; The comparison circuit compares the digital signal output by the analog-to-digital conversion circuit with the expected value to obtain the judgment result. Further, the analog-to-digital conversion circuit includes a voltage to current conversion circuit, a current amplification circuit $\Sigma$-$\Delta$ Type ADC, counter. Further, after the voltage/current selection circuit selects a currently quantized voltage vtest to be measured, the voltage signal vtest is processed into a converted current signal iv2i through the voltage to the second conversion circuit. After selecting a certain current ITest to be measured, the current signal is processed into a quantized current signal iin through the Trent amplification circuit, At the same time, the bandgap reference voltage Vbg is processed into the reference current signal Iref and the base current signal IOFs through another set of voltage to the first conversion circuit. The converted current signal iv2i or the quantized current signal iin and the base current signal IOFs discharge the load capacitance at one input end of the ADC. The reference current signal Iref is $\Sigma$-$\Delta$.

The load capacitor at one input of ADC is charged under the control of type a ADC feedback switch, and the reference voltage Vref is coupled to the other input of ADC. Driven by the clock signal CLK, $\Sigma$-$\Delta$ Type ADC works, quantizing the currently selected voltage or current into a digital signal Vout. Further, the voltage to first conversion circuit of the bandgap reference voltage Vbg can have the conversion ability from the bandgap reference voltage Vbg to the reference current signal Iref and from the bandgap reference voltage Vbg to the base current signal IOFs, the conversion function of the base current signal IOFs can be turned off by switching, and the conversion ability of the reference current signal Iref and the base current signal IOFs can have gain selection ability. Further, the voltage to second conversion circuit of the voltage to be measured vtest can have a resistance voltage division structure, and can support the voltage conversion capability of higher than one time the power supply voltage and lower than one time the ground voltage. Further, the voltage to the second conversion circuit of the voltage to be measured may have the same gain as the voltage of the bandgap reference voltage Vbg to the reference current signal Iref in the first conversion circuit, that is, exactly the same R1, R2 to RN. The voltage to first conversion circuit and the voltage to second conversion circuit maintain the same gain in design, and the switch with current mirror structure can control additional gain. Further, the current amplification circuit can have the ability of gain selection, such as realizing different current gains through current mirror and switch selection.

Further, the analog-to-digital conversion circuit has a switch to select whether voltage or current is currently detected, which can be selected by using the signal of the voltage/current selection circuit. Further, the reference current signal Iref is $\Sigma$-$\Delta$ Under the control of a type ADC feedback switch, the reference current signal Iref can be controlled to the ground potential through the inverse signal of the feedback switch beyond the charging time of the load capacitor at one input end of the ADC. Further $\Sigma$-$\Delta$ the driving clock signal CLK and the output digital signal Vout of type ADC can have a delay matching circuit. Further, the counter can be realized by a digital circuit, and the counter can be used $\Sigma$-$\Delta$ Drive clock signal CLK pair of type ADC $\Sigma$-$\Delta$ The digital signal output by type ADC is counted Vout, and additional clock can also be used to count the driving clock signal UK and the output digital signal Vout respectively. Further, the comparison circuit can be realized by a digital circuit. Optionally, based on the above circuit, the image sensor can have the detection ability of power supply, ground, internal reference voltage and internal reference current. The signal detection method of the image sensor can include: integrating the voltage/current detection circuit in the image sensor, connecting the desired detected power source, ground, internal reference voltage and internal reference current signals to the port of the voltage/current detection circuit, Quantify and judge the voltage/current detected by the gating of the voltage/current selection circuit. Further, the voltage/current detection circuit has an expandable number of ports. Further, the detection of voltage/current in the working process of image sensor has the form of time-sharing multiplexing; Voltage/current detection multiplexes subsequent circuits including ADC to save circuit resources. Further, during the working process of the image sensor, all the power supply, ground, internal reference voltage and internal reference current that are expected to be detected can have the function of completing the cycle detection in one frame time, and can also have the function of completing the cycle detection in multiple frames; Through time-sharing multiplexing, multi-channel voltage or current detection can be realized in one cycle. Further, the cyclic detection function during the working process of the image sensor can be carried out within the image quantization time, or separately within the non quantization time. Further, the threshold value for the image sensor to judge the quantized value of any power supply, ground, internal reference voltage and internal reference current can have a separate configuration function, such as setting through a register; Noise interference can be avoided by setting the judgment threshold independently. Further, after quantifying and judging any of the power supply, ground, internal reference voltage and internal reference current, if the image sensor believes that the voltage or current exceeds the expected range, it can have the function of reporting to the outside of the image sensor, such as by changing the pull-up or pull-down state of a specific pin. The voltage/current detection circuit of the above image sensor, based on the delta sigma ADC architecture, is compatible with level detection that is higher than one time the supply voltage and lower than one time the ground voltage. Voltage/current detection multiplexes subsequent circuits including ADC to save circuit resources. Through time-sharing multiplexing, multi-channel voltage or current detection can be realized in one cycle. Noise interference can be avoided by setting the judgment threshold independently. The voltage to first conversion circuit and the voltage to second conversion circuit maintain the same gain in design.

Fourth Embodiment

In a fourth embodiment, the present application provides a storage medium, specifically, a computer program is stored on the storage medium, and the signal detection method described above is realized when the computer program is executed by the processor. As described above, the signal detection circuit, method, image sensor and storage medium provided in this application are based on the delta sigma ADC architecture and can be compatible with level detection that is higher than one time the power supply voltage and lower than one time the ground voltage. The time-sharing multiplexing of voltage/current detection and subsequent circuits including ADC can realize multiple voltage or current detection in one cycle and save circuit resources. Noise interference can be avoided by setting the judgment threshold independently. The first conversion circuit and the second conversion circuit maintain the same gain in design. It should be noted that in this application, step codes such as S10 and S20 are used for the purpose of expressing the corresponding contents more clearly and concisely, which does not constitute a substantive limitation on the sequence. During specific implementation, those skilled in the art may execute S20 first and then S10, etc., but these should be within the scope of protection of this application. The embodiment of the storage medium provided in this application can contain all the technical features of any of the above method embodiments. The expanded and explained contents of the specification are basically the same as those of the above methods, and will not be repeated here. The embodiment of the application also provides a computer program product, which includes computer program code. When the computer program code is running on the computer, the computer will execute the methods in the above possible embodiments. The embodiment of the application also provides a chip, including a memory and a processor. The memory is used to store computer programs, and the processor is used to call and run computer programs from the memory, so that the device installed with the chip executes the methods in the above various possible embodiments.

It should be understood that the above-described scenario is only an example and does not constitute a limitation on the application scenario of the technical scheme provided by the embodiment of the application. The technical scheme of the application can also be applied to other scenarios. For example, those skilled in the art know that with the evolution of the system architecture and the emergence of new business scenarios, the technical solution provided by the embodiment of the application is also applicable to similar technical problems. The above serial number of the embodiments of this application is only for description and does not represent the advantages and disadvantages of the embodiments.

The steps in the method of the embodiment of the application can be adjusted, merged and deleted according to the actual needs. The units in the equipment of the embodiment of the application can be merged, divided and deleted according to actual needs.

In this application, the same or similar terms, concepts, technical solutions and/or application scenarios are generally described in detail only when they appear for the first time. When they reappear later, they are generally not repeated for the sake of brevity. When understanding the technical solutions and other contents of this application, for the same or similar terms, concepts, technical solutions and or application scenarios that are not described in detail later, You can refer to the previous detailed description. In this application, the description of each embodiment has its own emphasis. For the part not detailed or recorded in an embodiment, please refer to the relevant description of other embodiments. The technical features of the technical solution of the application can be combined arbitrarily. In order to simplify the description, all possible combinations of the technical features in the above embodiments are not described. However, as long as there is no contradiction in the combination of these technical features, it should be considered as the scope of the application.

The above is only the preferred embodiment of the application, and does not limit the scope of the patent of the application. All equivalent structure or equivalent process transformations made by using the contents of the description and drawings of the application, or directly or indirectly applied in other related technical fields, are similarly included in the scope of patent protection of the application.

What is claimed is:
1. An image sensor signal detection circuit capable of quantifying at least one of a power signal, grounding signal, internal reference voltage and internal reference current of the image sensor, comprising:

a bandgap reference voltage generator, a reference voltage generation circuit, a selection circuit, a signal quantization circuit and a comparison circuit;

the bandgap reference voltage generator is used to generate a first reference voltage;

the reference voltage generation circuit is used to generate a second reference voltage;

the selection circuit is used for selecting the signal to be tested;

the signal quantization circuit is respectively connected with the bandgap reference voltage generator, the reference voltage generation circuit and the selection circuit, and is used for digital quantization conversion of the signal to be measured to obtain quantization information according to the first reference voltage and the second reference voltage;

the comparison circuit is connected with the signal quantization circuit to generate the detection result of the signal to be tested according to whether the quantization information meets the preset conditions.

2. The signal detection circuit according to claim 1, wherein the signal quantization circuit comprises:

a current conversion circuit, Σ-Δ Type ADC and counter;

wherein the current conversion circuit includes a reference current source for converting the bandgap reference voltage into a reference current, and a current source to be measured for converting the signal to be measured into a current to be measured;

wherein the Σ-Δ Type ADC is used to perform analog-to-digital quantization conversion of the current to be measured according to the reference current and the reference voltage to obtain a quantized signal; and wherein the counter is used to generate the counting result as the quantization information according to the quantization signal.

3. The signal detection circuit according to claim 2, wherein the driving clock signal of the Σ-Δ type ADC and the output quantization signal have a delay matching circuit.

4. The signal detection circuit according to claim 2, wherein the counter uses the Σ-Δ type ADC drives the clock signal to count.

5. The signal detection circuit according to claim 2, wherein the signal quantization circuit also includes a current amplification circuit, and wherein when the signal to be detected selected by the selection circuit is a current signal, the current amplification circuit amplifies the current signal into the current to be detected.

6. The signal detection circuit according to claim 5, wherein the current amplification circuit realizes different current gains through current-mirrors and switches.

7. The signal detection circuit according to claim 2, wherein the current conversion circuit further comprises a base current source for converting the bandgap reference voltage into a base current; and wherein the base current source is connected in parallel with the current source to be measured.

8. The signal detection circuit according to claim 2, wherein the signal quantization circuit further comprises a load capacitor and a first comparator, the first end of the load capacitor is grounded, and the second end of the load capacitor is connected with the current input end of the current source to be tested and the current output end of the reference current source; the first input end of the first comparator is connected with the second end of the load capacitor, and the second input end of the first comparator inputs the reference voltage.

9. The signal detection circuit according to claim 8, wherein the signal quantization circuit also includes a charging control switch, the first end of the charging control switch is connected with the output end of the reference current, the second end of the charging control switch is connected with the second end of the load capacitor, and the third end of the charging control switch is connected with the output end of the first comparator.

10. The signal detection circuit according to claim 1, wherein the current conversion circuit comprises:

a first conversion circuit comprising a second comparator, at least one first switching device, at least one second switching device, a third switching device and a first resistor;

wherein the first input end of the second comparator inputs the reference voltage, the second input end of the second comparator is connected with the output end of the at least one first switch, the output end of the second comparator is connected with the control end of the at least one first switch and the control end of the at least one second switch, and the second input end of the second comparator is grounded through the first resistance; and wherein the control end of the at least one first switch and the input end of the at least one second switch are connected with the first preset voltage, the output end of the at least one second switch is connected with the control end and input end of the third switch, and the output end of the third switch is grounded.

11. The signal detection circuit according to claim 10, wherein the first conversion circuit further comprises at least one first switch, and at least one of the first switching devices is correspondingly connected to the second input of the second comparator through a first switch; and/or, the first conversion circuit also includes at least one second switch, and at least one second switch is correspondingly connected with the control end of the third switch through a second switch.

12. The signal detection circuit according to claim 10, wherein the first conversion circuit also includes a third switch, which is connected between the control end of the third switch and the ground.

13. The signal detection circuit according to claim 2, wherein the current conversion circuit comprises:

a second conversion circuit, which comprises a third comparator, at least one fourth switching device, a fifth switching device, a sixth switching device and a second resistor;

wherein the first input end of the third comparator inputs the voltage to be measured, the second input end of the third comparator is connected with the output end of the at least one fourth switch, the output end of the third comparator is connected with the control end of the at least one fourth switch and the control end of the fifth switch, and the second input end of the third comparator is grounded through the second resistance; and wherein the control end of the at least one fourth switch and the input end of the fifth switch are connected with a second preset voltage, the output end of the fifth switch is connected with the control end and input end of the sixth switch, and the output end of the sixth switch is grounded.

14. The signal detection circuit according to claim 13, wherein the second conversion circuit further comprises at least one fourth switch, and at least one of the fourth switching devices is correspondingly connected to the second input of the third comparator through a fourth switch.

15. The signal detection circuit according to claim 13, wherein the second conversion circuit also includes a voltage range selection circuit, and the voltage range selection circuit includes a fifth switch, a sixth switch, a seventh switch, a third resistor, a fourth resistor, a fifth resistor and a sixth resistor;
  the first end of the fifth switch, the sixth switch and the seventh switch inputs the voltage to be measured, and the second end of the seventh switch is connected with the first input end of the third comparator; and
  the second end of the fifth switch is grounded through the third resistance and the fourth resistance in series, the common end of the third resistance and the fourth resistance is connected to the first input end of the third comparator, and/or the second end of the sixth switch is connected to the third preset voltage through the fifth resistance and the sixth resistance in series, and the common end of the fifth resistance and the sixth resistance is connected to the first input end of the third comparator.

16. The signal detection circuit according to claim 13, wherein the second conversion circuit realizes different gains through current mirror structure and switch selection.

17. A signal detection method, wherein it is applied to the signal detection circuit according to claim 1, the signal detection method comprising:
  S1: In response to the selection of the signal to be measured, obtain the bandgap reference voltage and the reference voltage;
  S2: According to the reference voltage and the reference voltage, perform digital quantization conversion on the signal to be measured to obtain quantization information; and
  S3: Generate the detection result of the signal to be measured according to whether the quantization information meets the preset conditions.

18. The signal detection method according to claim 17, wherein the step of digital quantization conversion of the signal to be measured to obtain quantization information according to the reference voltage and the bandgap reference voltage comprises:
  S10: convert the signal to be measured into the current to be measured;
  S20: discharge the load capacitance of the comparator with the current to be measured;
  S30: when the voltage of the load capacitor is less than the reference voltage, charge the load capacitor with a reference current until the voltage of the load capacitor is greater than the reference voltage; and
  S40: when the voltage of the load capacitor is greater than the reference voltage, disconnect the reference current until the voltage of the load capacitor is less than the reference voltage, and return to S30.

19. The signal detection method according to claim 18, wherein the step of discharging the load capacitance of the comparator with the current to be measured comprises:
  S21: discharge the load capacitor with base current;
  S22: when the voltage of the load capacitor is less than the reference voltage, charge the load capacitor with the reference current until the voltage of the load capacitor is greater than the reference voltage; and
  S23: when the voltage of the load capacitor is greater than the reference voltage, disconnect the reference current until the voltage of the load capacitor is less than the reference voltage, and return to S21.

20. The signal detection method according to claim 19, wherein the step of discharging the load capacitance of the comparator with the current to be measured comprises the step of discharging the load capacitor simultaneously with the base current and the current to be measured in parallel.

21. The signal detection method according to claim 18, wherein the step of charging the load capacitor with a reference current comprises the step of, in response to acquiring a reference voltage, the bandgap reference voltage is converted into the reference current, the base current, and/or the reference voltage.

22. The signal detection method according to claim 18, wherein the step of generating the detection result of the signal to be tested according to whether the quantization information meets the preset conditions comprises the steps of:
  charging the load capacitor with the reference current and the step of discharging the load capacitor of the comparator with the current to be measured modulate the waveform information according to the clock signal to describe the duty cycle of the quantization information, and the counter counts the quantization information according to the clock signal and outputs the counting result;
  when the counting result is in the preset threshold range, it is determined that the signal to be measured meets the working requirements;
  when the counting result exceeds the preset threshold interval, it is determined that the signal to be measured does not meet the working requirements.

23. The signal detection method according to claim 17, wherein the signal to be measured is selected from at least one of voltage signal, current signal, power signal and ground signal.

24. An image sensor, wherein the image sensor comprises a signal detection circuit according to claim 1, wherein the image sensor comprises an interconnected processor and a storage medium, wherein:
  the storage medium is used for storing computer programs; and
  the processor is used for executing the computer program to realize the signal detection method according to claim 17.

25. The image sensor according to claim 24, wherein the image sensor realizes the signal detection method within at least one frame by time-sharing multiplexing.

26. The image sensor according to claim 24, wherein the image sensor synchronously realizes the signal detection method within the image quantization time.

27. The image sensor according to claim 24, wherein the image sensor sets a preset threshold interval through a register.

28. The image sensor according to claim 27, wherein when the detection result exceeds the preset threshold range, the image sensor generates overrun report information.

29. A storage medium, wherein a computer program is stored on the storage medium, and the signal detection method according to claim 17 is realized when the computer program is executed by a processor.

* * * * *